(12) United States Patent
McGuyer et al.

(10) Patent No.: US 7,825,736 B2
(45) Date of Patent: Nov. 2, 2010

(54) METHOD FOR SUPPRESSING LIGHT SHIFT IN OPTICAL PUMPING SYSTEMS

(75) Inventors: Bart H. McGuyer, Princeton, NJ (US);
Yuan-Yu Jau, Princeton, NJ (US);
William Happer, Princeton, NJ (US)

(73) Assignee: Princeton University, Princeton, NJ (US)

( * ) Notice: Subject to any disclaimer, the term of this patent is extended or adjusted under 35 U.S.C. 154(b) by 188 days.

(21) Appl. No.: 12/338,044

(22) Filed: Dec. 18, 2008

(65) Prior Publication Data
US 2010/0156547 A1 Jun. 24, 2010

(51) Int. Cl.
*H03L 7/26* (2006.01)
(52) U.S. Cl. .......................................... 331/3
(58) Field of Classification Search .................. 331/3, 331/94.1
See application file for complete search history.

(56) References Cited

U.S. PATENT DOCUMENTS 5,148,437 A * 9/1992 Ohtsu ........................ 372/32

OTHER PUBLICATIONS

Zhu, M., "Optical Pumping Method to Reduce Light Shift in a Vapor Cell Atomic Frequency Standard", IEEE Frequency Control Symposium I-4244-0647-1, pp. 1334-1338 (2007).
Affolderback et al., "Light-shift Suppression in Laser Optically Pumped Vapour-Cell Atomic Frequency Standards", Appl Phys B Lasers and Optics 80:841-848 (2005).
Shah et al., "Continuous Light-Shift Correction in Modulated Coherent Population Trapping Clocks", Appl Phys Lett 89, 151124-1 to 151124-3 (2006).
Vanier et al., "The Passive Optically Pumped Rb Frequency Standard: The Laser Approach", Appl Phys B: Lasers and Optics 87:565-593 (2007).
Hashimoto et al., "A Novel Method to Compensate for the Effect of Light Shift in a Rubidium Atomic Clock Pumped by a Semiconductor Laser", IEEE Transactions on Instrumentation and Measurement 39(3):458-462 (1990).
Gong et al., "Nonlinear Pressure Shifts of Alkali-Metal Atoms in Inert Gases", Phys Rev Lett 100, 233002-1 to 233002-4 (2008).
Deng, Jinquan, "Light Shift Compensation in a Rb Gas Cell Frequency Standard with Two-Laser Pumping", IEEE Transactions on Ultrasonics, Ferroelectrics, and Frequency Control 48(6):1657-1661 (2001).
Mathur et al., "Light Shifts in the Alkali Atoms", Phys Rev 171(1):11-19 (1968).
Camparo, James, "The Rubidium Atomic Clock and Basic Research", Phys Today 60:33-39 (2007).

* cited by examiner

*Primary Examiner*—David Mis
(74) *Attorney, Agent, or Firm*—Porzio, Bromberg, & Newman, PC

(57) ABSTRACT

The present invention relates to a method and system to suppress or eliminate light shift in an optical pumping system, such as an atomic clock. The method uses modulation of a radiation source, such as a radio frequency or microwave source, to simultaneously lock the frequency of the radiation source to an atomic resonance and lock the frequency of the optical pumping source in order to suppress or eliminate light shift. In one embodiment, the method of the present invention directly utilizes the out-of-phase channel of a lock-in amplifier to additionally lock an optical pumping source to a zero-light-shift frequency, where the in-phase channel is used to lock the frequency of the radiation source to an atomic resonance.

20 Claims, 17 Drawing Sheets

20

21 — OPTICALLY PUMPING AN ATOMIC SAMPLE OF AN OPTICAL PUMPING SYSTEM WITH A PUMPING SOURCE

22 — EXCITING ATOMIC RESONANCES WITH A MODULATED RADIATION SOURCE

24 — SIMULTANEOUSLY LOCKING A FREQUENCY OF THE RADIATION SOURCE TO AN ATOMIC RESONANCE AND LOCKING A FREQUENCY OF THE PUMPING SOURCE USING ERROR SIGNALS DUE TO THE MODULATED RADIATION SOURCE THEREBY SUPPRESSING OR ELIMINATING LIGHT SHIFT IN THE OPTICAL PUMPING SYSTEM

FIG. 2

METHOD FOR SUPPRESSING LIGHT SHIFT IN OPTICAL PUMPING SYSTEMS

STATEMENT OF GOVERNMENT FUNDED RESEARCH

This work was supported by the Air Force Office Scientific Research 245-6581 and Department of Defense NDSEG Fellowship. Accordingly, the Government has certain rights in this invention.

BACKGROUND OF THE INVENTION

1. Field of the Invention

The present invention relates to the field of optically pumped atomic frequency standards and other optical pumping systems, and more particularly to a method and system for suppressing or eliminating light shift in an optical pumping system by using a modulated radiation source for simultaneously locking the frequency of the radiation source to an atomic resonance and locking the frequency of the optical pumping source.

2. Description of the Related Art

Two examples of optical pumping systems are atomic frequency standards and atomic magnetometers. Atomic frequency standards, or atomic clocks, are applied in various systems that require extremely accurate frequency measurements. Atomic magnetometers are utilized in magnetic field detection with extremely high sensitivity. For example, atomic clocks are used in GPS (global positioning system) satellites and other navigation systems, as well as in high-speed digital communication systems, scientific experiments, and military applications. Magnetometers are used in medical systems, scientific experiments, industry and military applications.

Optical pumping of atomic samples in optical pumping systems is accomplished by means of one or more pumping sources, which for example can be a discharge lamp or a laser. Optical pumping systems use an atomic sample, which can comprise an atomic vapor cell, an atomic beam, or an atom trap. Atomic samples can contain one or several atomic species used for optical pumping, such as an alkali metal or an ion such as mercury. Additionally, atomic samples can comprise artificial atomic species, for example self-assembled quantum dots, qubits, or isolated single-spin systems such as nitrogen vacancy defects in diamond.

One example of an atomic system is an alkali-metal vapor cell, such as is used in conventional atomic clocks and magnetometers. Alkali-metal vapor cells contain a few droplets of an alkali metal, such as potassium, rubidium, or cesium. A buffer gas, such as nitrogen, other noble gases, or a mixture thereof, is required to be filled inside the cell to match the spectral profile of the pumping light, suppress the radiation trapping, and diminish alkali-metal atoms diffusing to the cell wall. The vapor cell is heated up to above room temperature to produce sufficient alkali-metal vapor.

Optical pumping systems often use a radiation source to excite atomic resonances. Conventionally, an atomic clock or a magnetometer measures the frequency at the maximum response of an atomic resonance. A radiation source is required to generate the oscillation signal and excite the resonance. A precise clock ticking signal is therefore provided by the output of the radiation source. The atomic resonances of alkali-metal ground-state hyperfine sublevels are especially useful for atomic clocks and atomic magnetometers. The hyperfine resonance is excited by the radiation source through radio frequency (RF) fields, microwave fields, or modulated light (CPT: coherent population trapping method).

U.S. Pat. No. 7,323,941, hereby incorporated by reference in its entirety into this application, describes a self-modulated laser system at an alkali-metal atom hyperfine frequency. The self-modulated laser system uses a polarization gain medium, such as an electronically pumped semiconductor, for example, quantum well heterojunction edge-emitting laser diode (ELD). A polarization gain medium outputs light with linear polarization. Alternation of photon spin is used inside the laser cavity. The vapor cell is positioned where the laser beam has the maximum alternation of the light polarization. Beams are recombined so that they emerge as a single beam of alternating circular polarization. The transmission of light through the external cavity is measured with a photodiode to generate a clock signal.

FIG. 1A depicts the main components of a conventional vapor-cell clock. Vapor cell 10 contains an alkali-metal vapor, typically rubidium or cesium, and an inert buffer gas. Pumping light propagates through vapor cell 10 and is collected by photodetector 12. Horn 13 beams microwaves at the cell from frequency synthesizer 14.

Modulation of the radiation source in an optical pumping system is often used in order to lock the radiation source to an atomic resonance. For example, conventional clocks use frequency or phase modulation to lock a microwave frequency to the ground state 0-0 hyperfine transition of an alkali metal. FIG. 1B shows pumping light transmission for microwaves near the 0-0 resonance. Modulation of the microwaves produces modulation in the transmitted light. Phase sensitive detection with lock-in amplifier 15 of transmission modulation generates the error signal in FIG. 1C, which is roughly the derivative of transmission. Feedback with PID controller 16 locks the frequency of the microwave source to the error signal zero-crossing, corresponding to the 0-0 frequency. Similar feedback systems are used in other optical pumping systems to lock a radiation source to an atomic resonance.

The light shift refers to the shift in an atomic resonance due to optical pumping. The light shift is a result of the AC Stark effect, and it depends on both the frequency and intensity of the pumping source. See B. S. Mathur, H. Tang, and W. Happer, Physical Review 171, 11 (1968). The light shift has important consequences in optical pumping systems. For example, in atomic clocks the light shift leads to errors such as clock frequency offset, noise, and drift. It is desirable to suppress or eliminate the light shift in optical pumping systems.

Conventional vapor-cell clocks, such as the passive rubidium frequency standard, do not eliminate the light shift. Instead, conventional clocks mitigate the light shift through using a lamp as a pumping source. Lamp pumping sources provide very stable pumping intensity with a large frequency spread, which act together to reduce and stabilize the light shift. Even with the best lamp sources, conventional clocks still experience clock frequency errors due to the light shift.

Theoretically, laser pumped standards should perform better than lamp pumped standards. However, it has been found that comparable laser pumped standards perform worse than lamp pump standards. Laboratory laser pumped standards have reached the expected performance, though at the cost of greatly increased complexity. As a result, laser pumped standards are still not yet commercially available. See J. Camparo, Physics Today 60, 33 (2007) and J. Vanier and C. Mandache, Appl. Phys. B 87, 565 (2007). The light shift is one of the main reasons for the limited performance of laser pumped standards.

One direct method to eliminate the light shift is to extrapolate measurements to zero pumping intensity. While feasible, this method is not practical for frequency standards or other devices that require continuous measurement and light shift elimination. Additionally, in practice, other effects such as non-uniform pumping light can introduce nonlinearity into the light shift, which may prevent this method from working.

Additionally, there are semi-continuous methods to eliminate the light shift, which have a main disadvantage in that measurement is interrupted in order to remove the light shift. One example is pulsed optical pumping, where the pumping light is turned off during measurement, as described in J. Vanier and C. Mandache, Appl. Phys. B 87, 565 (2007). Another example is periodic pumping frequency correction through measurement of light shift induced asymmetry of the resonance lineshape, as described in M. Hashimoto and M. Ohtsu, IEEE Trans. Instrum. Meas. 39, 458 (1990).

The light shift is truly eliminated if the pumping source is locked to a zero-light-shift frequency, or a frequency that produces no light shift. One such method uses slight pumping source intensity modulation to generate feedback and lock the optical frequency of a laser pumping source to a zero-shift frequency. The disadvantages of this method are that it requires additional modulation and expensive components, and that it typically is slow. See V. Shah, V. Gerginov, P. D. D. Schwindt, S. Knappe, L. Hollberg, and J. Kitching, Appl. Phys. Lett. 89, 151124 (2006), and F. Gong, Y.-Y. Jau, and W. Happer, Phys. Rev. Lett. 100, 233002 (2008).

Alternate continuous elimination methods include using more complicated optical pumping schemes, as described in M. Zhu, IEEE Frequency Control Symposium, 1334 (2007), multiple lasers, as described in J. Deng, IEEE Trans. UFFC 48, 1657 (2001), or modulated pumping light that cancels light shift, as described in C. Affolderbach, C. Andreeva, S. Cartaleva, T. Karaulanov, G. Mileti, and D. Slavov, Appl. Phys. B 80, 841 (2005). Disadvantages of these methods are that they require multiple lasers or modulation schemes, and that they add expensive components and additional complexity to the system.

An alternative to elimination is to suppress the light shift by stabilizing the frequency of the pumping source. One such method involves modulating a laser pumping source in order to lock the pumping source frequency to an optical absorption feature of an atomic sample, which may or may not be the same atomic sample in the optical pumping system. The main disadvantage of such previous methods is that the pumping source frequency is not locked to the zero-shift frequency, which may drift over time. Therefore, even if the locked pumping source frequency is initially offset to match the zero-shift frequency, the two frequencies will likely drift apart over time. Other disadvantages of such previous methods are that they require additional modulation, that the locked pumping source frequency varies with different atomic samples, and that the locked pumping source frequency may drift.

It is desirable to provide an improved method and system for suppressing or eliminating light shift in an optical pumping system.

SUMMARY OF THE INVENTION

The present invention relates to a method and system to suppress or eliminate light shift in an optical pumping system, such as an atomic clock. The method uses modulation of a radiation source, such as a radio frequency (RF) or microwave source, to simultaneously lock the frequencies of both the radiation and the optical pumping sources in order to suppress or eliminate light shift. The method extends the conventional feedback technique of modulating a radiation source to stabilize its frequency to an atomic resonance, to additionally suppress or eliminate the light shift. In one embodiment, the method of the present invention directly utilizes the out-of-phase (quadrature) channel from a lock-in amplifier to additionally lock an optical pumping source to a zero-light-shift frequency, where the in-phase channel is used to lock the frequency of the radiation source to an atomic resonance. A number of advantages of some embodiments include using fewer additional components, offering improved performance, reducing cost, and being more easily miniaturized than conventional systems to eliminate light shift. Additionally, some embodiments of the method can be easily implemented in conventional vapor-cell atomic clocks. The method is useful for atomic frequency standards and other optical pumping systems that experience light shift.

The invention will be more fully described by reference to the following drawings.

BRIEF DESCRIPTION OF THE DRAWINGS

FIG. 2 is a flow diagram of a method for suppressing or eliminating light shift in an optical pumping system in accordance with the teachings of the present invention.

DETAILED DESCRIPTION

Figure 1A:
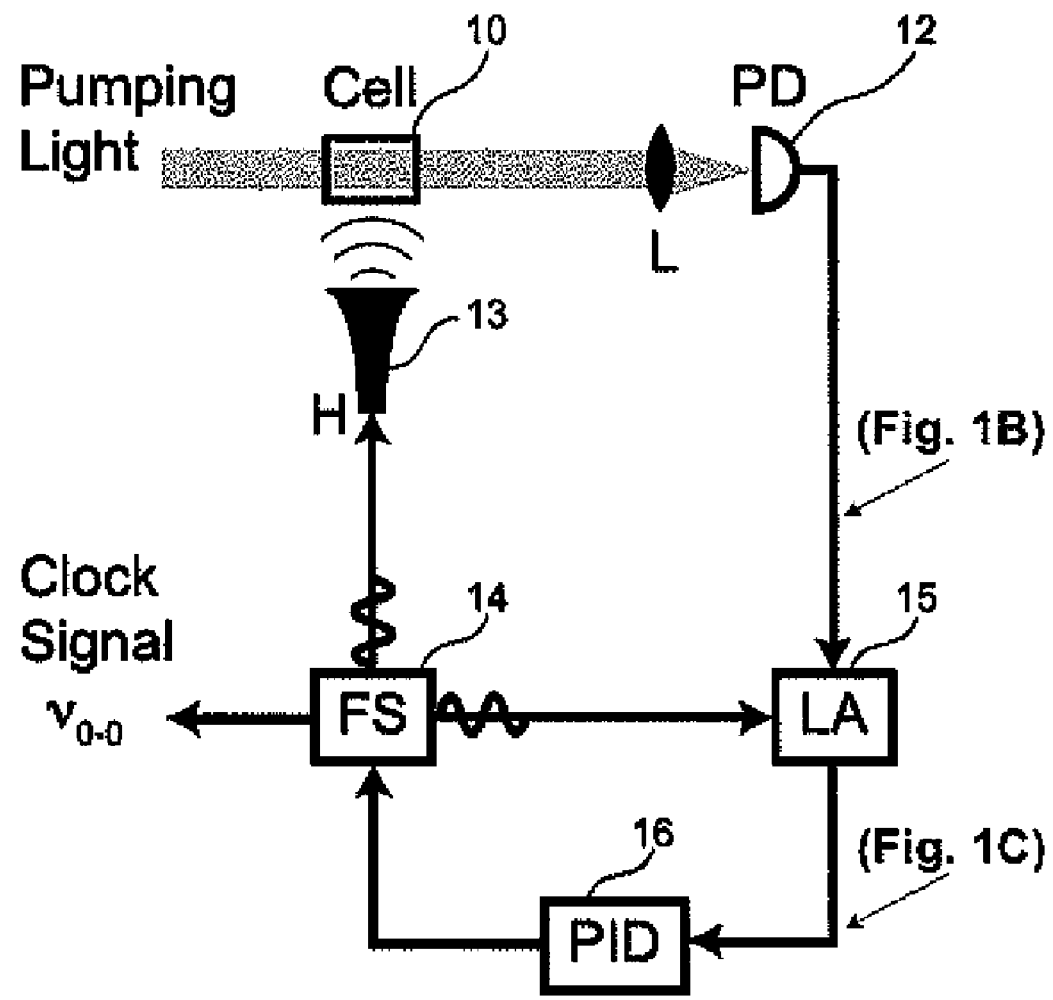
FIG. 1A is a schematic diagram of a prior art conventional vapor-cell atomic clock.
Figure 1B:
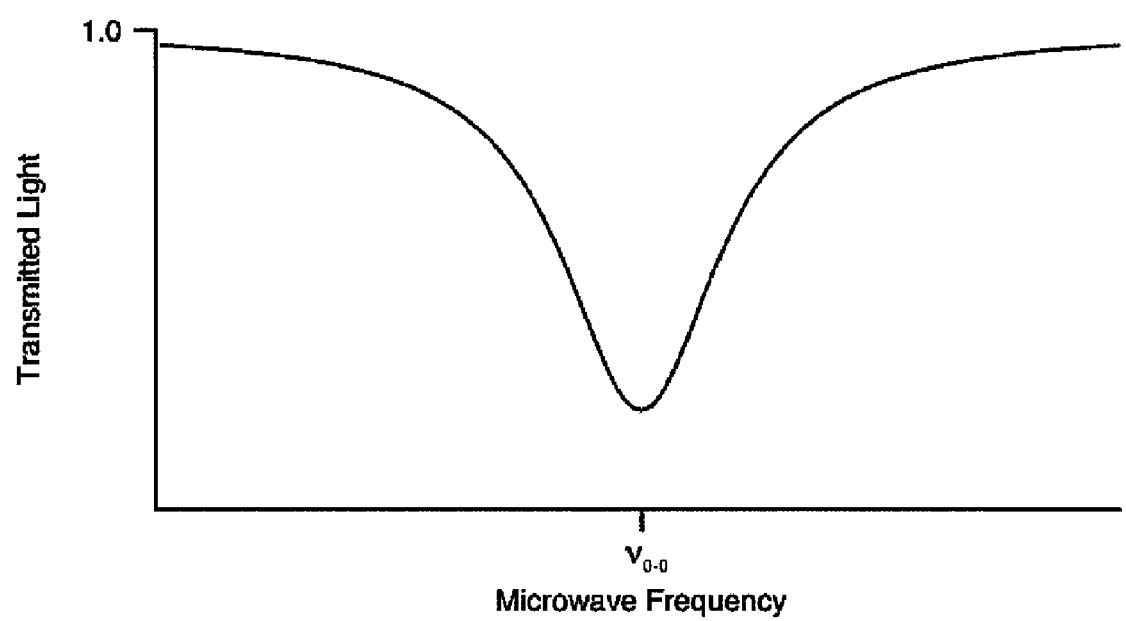
FIG. 1B is a graph of pumping light transmission versus microwave frequency in a prior art conventional vapor-cell atomic clock.
Figure 1C:
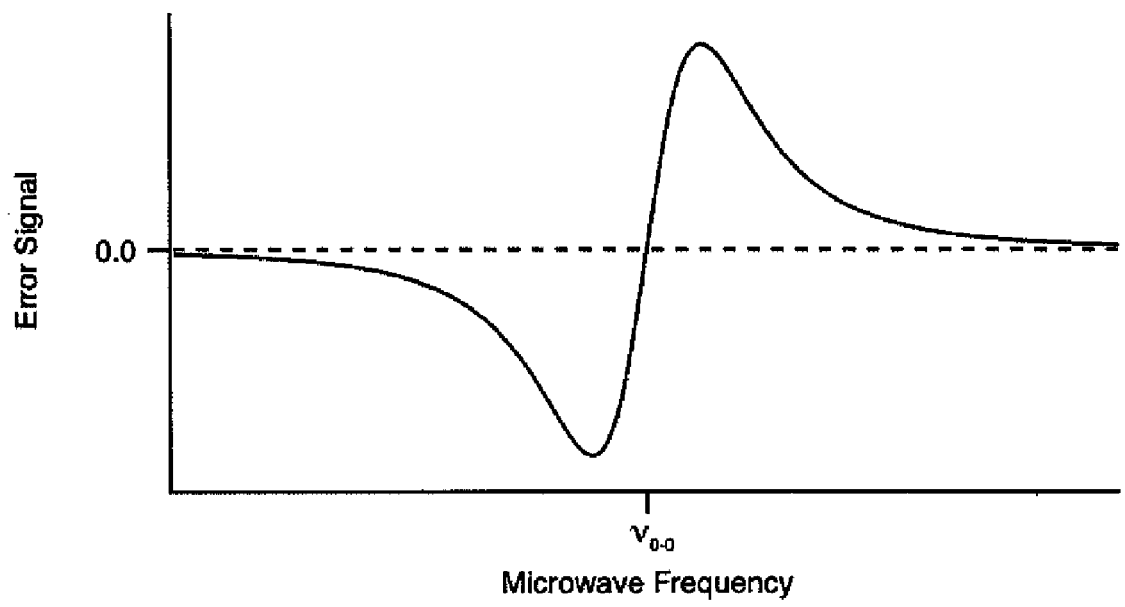
FIG. 1C is a graph of a microwave error signal in a prior art conventional vapor-cell atomic clock.

Reference will now be made in greater detail to embodiments of the invention, examples of which are illustrated in the accompanying drawings. Wherever possible, the same reference numerals will be used throughout the drawings and the description to refer to the same or like parts.

FIG. 2 is a flow diagram of a method for suppressing light shift in an optical pumping system 20. In block 21, an atomic sample of an optical pumping system is pumped by a pumping source in an optical pumping system. Examples of optical pumping systems include atomic clocks, atomic magnetometers, masers, spectroscopy systems associated with optical pumping, and other atomic systems associated with optical pumping. Examples of atomic samples include atomic vapor cells, atomic beams, and atom traps. An example of a pumping source is a laser. In block 22, atomic resonances are excited with a modulated radiation source. Examples of modulation methods include frequency or phase modulation methods. Example radiation sources include radio frequency (RF) fields, microwave fields, or modulated light in a coherent population trapping method (CPT). Alternatively, double resonance spectroscopy can be used for exciting atomic resonances. In block 24, error signals due to the modulated radiation source are used to simultaneously lock the frequency of the radiation source to an atomic resonance and lock the frequency of the optical pumping source in order to suppress or eliminate light shift in the optical pumping system. In an embodiment, the pumping source can be locked to a zero-light-shift frequency, thereby eliminating light shift in the optical pumping system.

In one embodiment, the error signal for suppressing or eliminating light shift is directly obtained from the quadrature channel of a phase sensitive detector, such as a lock-in amplifier, in which the in-phase channel is used for locking the radiation source to an atomic resonance. The quadrature channel output can be monitored during an adjustment of the frequency of the pumping source until zero output of the quadrature channel and zero output of the in-phase channel is obtained. Accordingly, when the quadrature error signal is zero, the frequency of the pumping source is locked to suppress or eliminate light shift in the optical pumping system.

Method 20 of the present invention uses an additional error signal due to modulation of the radiation source, which is conventionally used to produce an error signal for feedback to lock the radiation source to an atomic resonance, for feedback to lock the frequency of the pumping source to suppress or eliminate light shift. It has been found that modulation of the radiation source near an atomic resonance induces self-intensity-modulation of the pumping light in an atomic sample. Pumping light is absorbed during propagation through an atomic sample, resulting in pumping light intensity decay. Near-resonant radiation alters the degree of absorption and affects the pumping intensity profile through the atomic sample. Therefore modulation of the radiation source induces self-intensity-modulation of the pumping light intensity in an atomic sample, which leads to a modulation of the atomic resonance due to the light shift effect.

Figure 3:
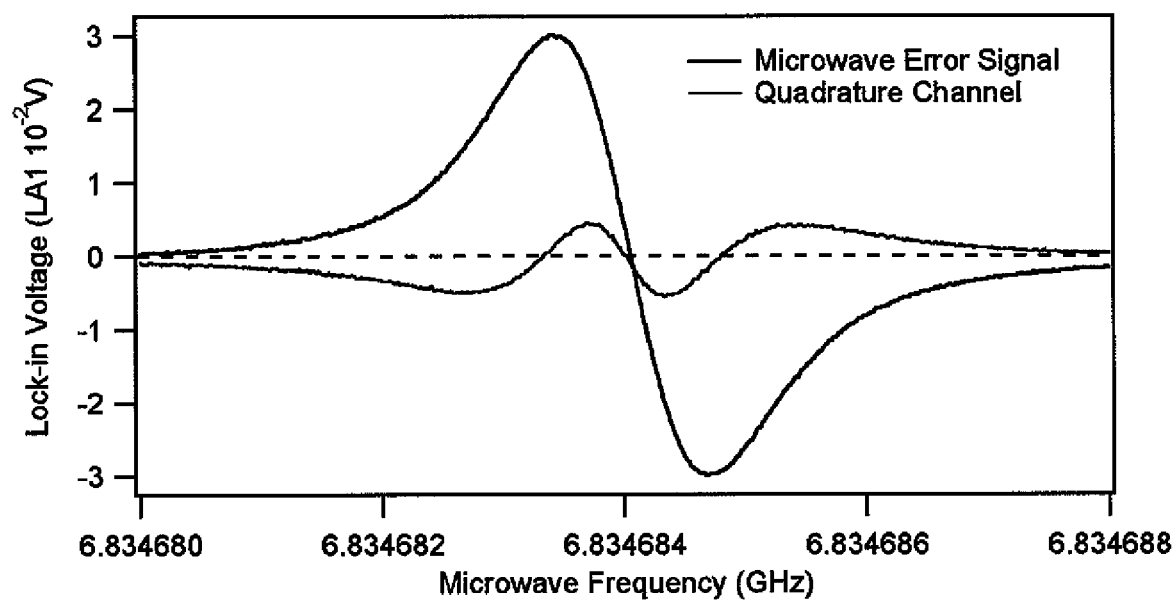
FIG. 3 is a graph of an experimental result for in-phase and out-of-phase error signals due to radiation source modulation near an atomic resonance.

The resultant modulation of the atomic resonance can in turn be used to produce an error signal to lock the pumping source frequency to suppress or eliminate light shift. For example, in one embodiment, phase sensitive detection of transmitted pumping light intensity is used to produce the error signals for the pumping and radiation sources. It is known that without the light shift effect, when the radiation source frequency is tuned to the atomic resonance frequency, no $1^{st}$ harmonic of the modulation frequency can be found in the transmitted pumping light intensity. There are zero outputs from both in-phase and out-of-phase (quadrature) channels of a phase sensitive detector measuring pumping light transmission, which is referenced to the modulation frequency of the radiation source. With the presence of the light shift, the self-intensity-modulation of the atomic sample causes a modulation of the resonance frequency. This nonlinear effect leads to a non-vanishing $1^{st}$ harmonic signal in the transmitted intensity. Accordingly, there is always at least one non-zero output from the two orthogonal channels of the phase sensitive detector. Therefore, the zero-crossings of the two orthogonal error signals only coincide if there is no light shift, and do not coincide in the presence of light shift as shown in FIG. 3.

It has been found that the non-vanishing $1^{st}$ harmonic signal changes sign when the pumping source frequency sweeps across the zero-light-shift point. The offset of the in-phase and quadrature zero crossings vanishes when the pumping source is tuned to a frequency that produces no light shift. In one embodiment of the present invention, this signal is used as the error signal to lock the pumping source frequency to suppress or eliminate light shift. In an embodiment, the phase of the phase sensitive detector can be adjusted to optimize the in-phase signal as an error signal for stabilizing the frequency of the radiation source and the out-of-phase signal as an error signal for stabilizing the frequency of the pumping light source to suppress or eliminate light shift.

It is to be understood that the above description of producing the two error signals due to the self-intensity-modulation resulting from the modulation of the radiation source is just one example of an embodiment of the present invention. For example, other schemes besides detection of transmitted pumping light can be used to produce the error signals, such as detection of fluorescent emission, probe beam transmission, or magnetic properties of the atomic sample. Other harmonics, such as the $3^{rd}$ harmonic, can be used in phase sensitive detection. Additionally, the two error signals need not come from the same detector or from phase sensitive detection of the same harmonic.

Figure 4:
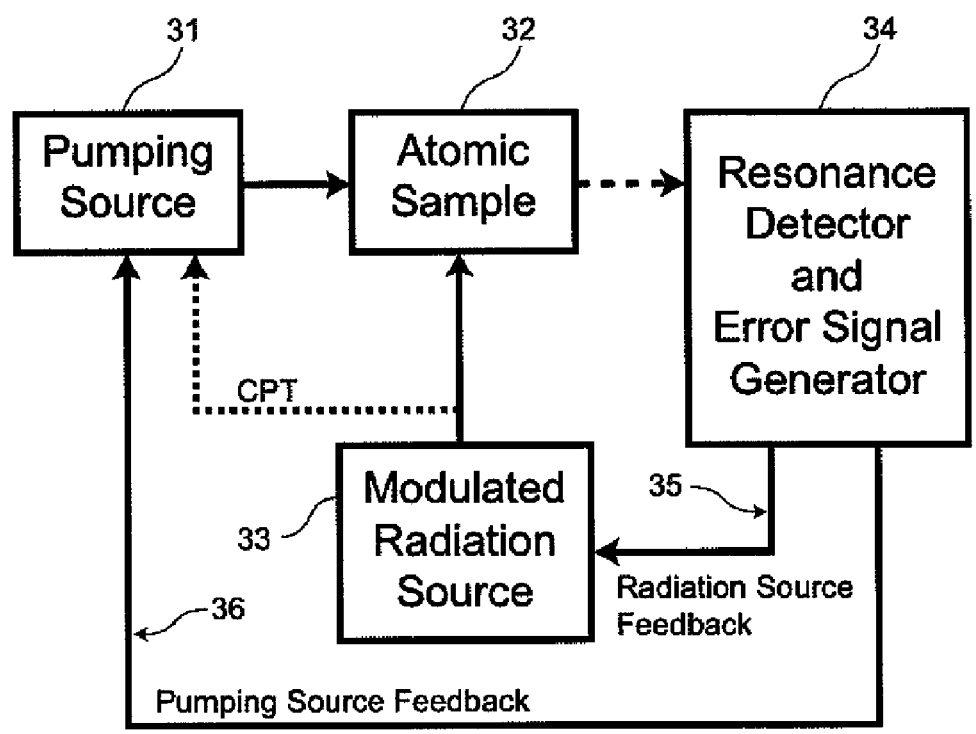
FIG. 4 is a schematic diagram of an embodiment of a system for suppressing or eliminating light shift in an optical pumping system in accordance with the teachings of the present invention.

FIG. 4 is a schematic diagram of an embodiment of a system 30 for suppressing or eliminating light shift in an optical pumping system in accordance with the teachings of the present invention. System 30 comprises means for optically pumping atomic sample 32 with pumping source 31, means for exciting atomic resonances with modulated radiation source 33, and means for simultaneously locking a frequency of the radiation source to an atomic resonance and locking a frequency of the pumping source using error signals due to the modulated radiation source, here embodied by resonance detector and error signal generator 34. System 30 incorporates two feedback loops. First feedback loop 35 locks radiation source 33 to an atomic resonance. Second feedback loop 36 locks pumping source 31 in order to suppress or eliminate light shift in the optical pumping system. In one embodiment, pumping source 31 can be locked to a zero-light-shift frequency, thereby eliminating light shift in the optical pumping system.

Examples of optical pumping systems that can be used in an embodiment of system 30 include an atomic frequency standard, an atomic clock, an atomic magnetometer, a maser, a spectroscopy system associated with optical pumping, or an atomic system associated with optical pumping. Atomic sample 32 can comprise an atomic vapor cell, an atomic beam, or an atom trap. Pumping source 31 can comprise a laser. Radiation source 33 can comprise a radio frequency source or a microwave source. Pumping source 31 and radiation source 33 can be combined in a coherent population trapping method (CPT), as depicted by the dashed arrow labeled CPT. Pumping source 31 and radiation source 33 can comprise a double resonance spectroscopy method. The method of modulation of radiation source 33 can be a frequency modulation method or a phase modulation method. In one embodiment, the error signal for locking pumping source 31 is obtained from the out-of-phase signal of a phase sensitive detector, where an in-phase signal from the phase sensitive detector is used for locking radiation source 33. The invention can be further illustrated by the following examples thereof, although it will be understood that these examples are included merely for purposes of illustration and are not intended to limit the scope of the invention unless otherwise specifically indicated. All percentages, ratios, and parts herein, in the Specification, Examples, and Claims, are by weight and are approximations unless otherwise stated.

Figure 5:
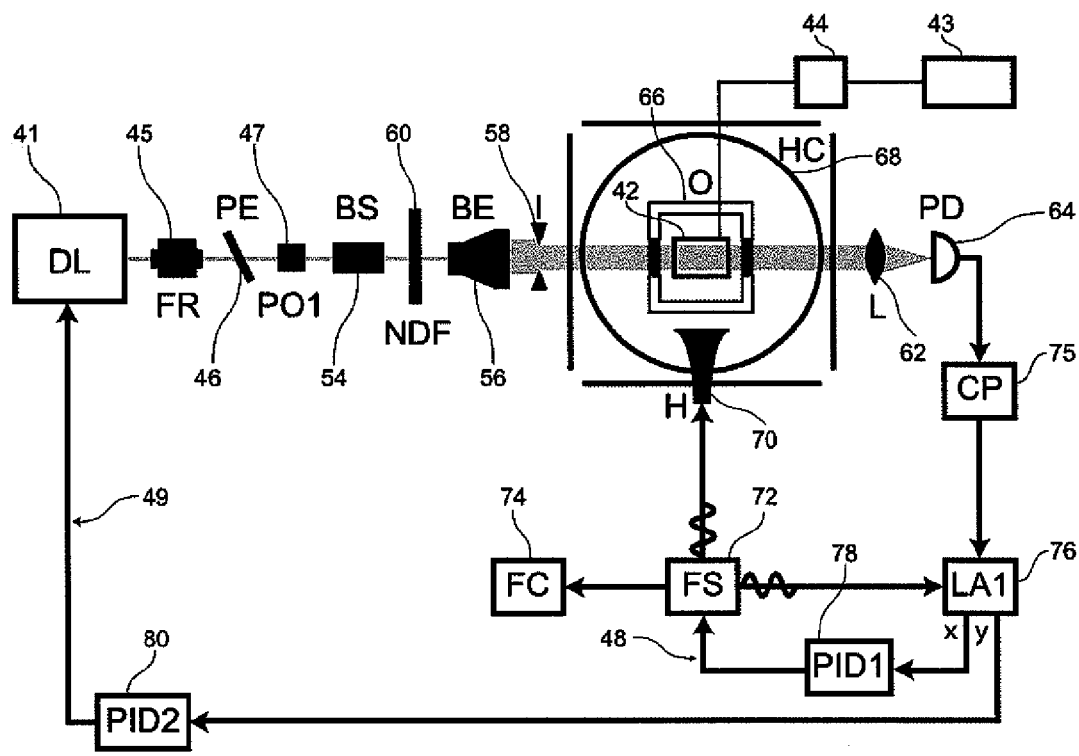
FIG. 5 is a schematic diagram of an embodiment of a system for suppressing light shift in an optical pumping system in accordance with the teachings of the present invention, and used for an experimental test of the system of the present invention.

An experimental test of the method 20 and system 30 of the present invention was performed. FIG. 5 is a schematic diagram of an embodiment of a system 40 for suppressing light shift in an optical pumping system in accordance with the teachings of the present invention, used for an experimental test of the system of the present invention. System 40 includes two feedback loops to measure an atomic clock frequency without light shift. First feedback loop 48 locks radiation source 72 to the clock frequency. Second feedback loop 49 locks the pumping source 41 to eliminate light shift. With both feedback loops engaged, the setup is capable of measuring the clock frequency without light shift to within an accuracy of ±1 Hz or greater.

In this embodiment, diode laser (DL) 41 provides optical pumping light to vapor cell 42. For example, diode laser (DL) 41 can provide 795 nm $^{87}$Rb D1 light. Vapor cell 42, including a buffer gas, such as nitrogen, and an alkali metal, such as potassium, rubidium, or cesium, can be used as an alkali-metal vapor atomic sample. Vapor cell 42 can be a cylindrical Pyrex glass vapor cell, 17 mm in diameter and 25 cm long, filled with a small amount of $^{87}$Rb metal, in which case the clock frequency can be the 0-0 hyperfine resonance of $^{87}$Rb. Faraday rotator (FR) 45 isolates diode laser 41 from back-reflected light. Vapor cell 42 can be attached to buffer-gas reservoir 43 and pressure gauge 44 to allow changing of the buffer-gas species and pressure. Pellicle (PE) 46 skims off a small amount of light for analysis, such as with a wavemeter and Fabry-Perot interferometer. Polarizer (PO1) 47 ensures the pumping light is linearly polarized. Beam shaper (BS) 54, beam expander (BE) 56, and Iris (I) 58 ensure that the pumping light fills the cell uniformly. A neutral density filter (NDF) 60 adjusts the pumping beam intensity. Lens (L) 62 collects pumping light transmitted through vapor cell 42 onto photodetector (PD) 64.

Air-heated, non-magnetic oven (O) 66 holds vapor cell 42 at constant temperature, such as in the range of about 40-60° C., which in turn sets the alkali vapor density and cell optical thickness. Helmholtz coils (HC) 68 cancel ambient magnetic fields and provide a magnetic field parallel to the pumping light on the order of $B_z$~0.2 G.

In this embodiment, horn (H) 70 is used to transmit linearly polarized microwaves at vapor cell 42 from frequency synthesizer (FS) 72, with the magnetic field axis parallel to the pumping light direction. Frequency counter (FC) 74, referenced to an external rubidium frequency standard, measures the clock frequency. The microwaves are frequency modulated at a rate of about 100 to about 500 Hz. Current preamplifier (CP) 75 amplifies the signal from photo detector 64. Lock-in amplifier (LA1) 76 with a 10-300 ms time constant receives the signal from current preamplifier (CP) 75. The in-phase channel (x) of lock-in LA1 76 provides a first error signal for PID controller (PID1) 78 to lock the microwave frequency to the 0-0 hyperfine transition in first feedback loop 48.

Second feedback loop 49 includes PID controller (PID2) 80 to lock diode laser (DL) 41 to the zero-light-shift frequency. The quadrature channel (y) of lock-in LA1 76 provides the error signal. As a test of whether diode laser (DL) 41 is locked to a zero-shift frequency, rotatable NDF filter 60 was used to temporarily reduce the pumping intensity by a factor of 2 to 4 in order to verify that the clock frequency is intensity-independent, and thus free of the light shift.

Figure 6:
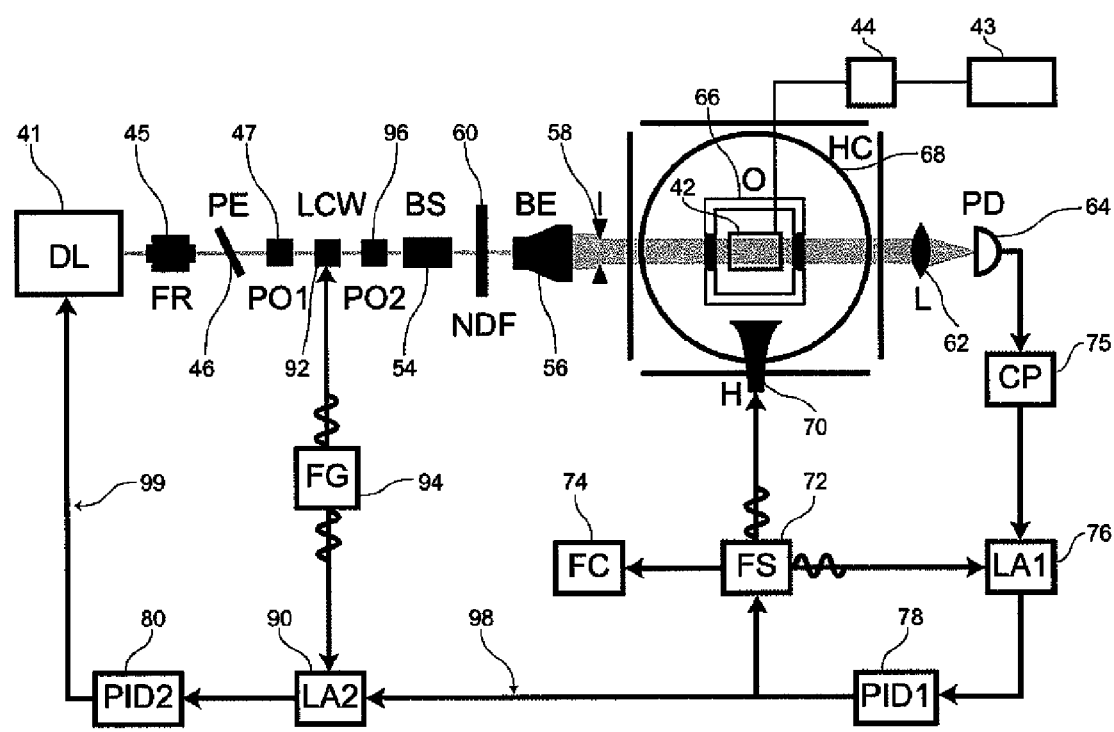
FIG. 6 is a schematic diagram of a system using a conventional, intensity-modulation method to eliminate light shift in an optical pumping system.

FIG. 6 is a schematic of a system 50 using an intensity-modulation based light shift elimination method, as described in F. Gong, Y.-Y. Jau, and W. Happer, Phys. Rev. Lett. 100, (2008). For the intensity-modulation based method, a second lock-in amplifier (LA2) 90 provides the error signal for second feedback loop 99 by detecting modulation in the error signal of first feedback loop 98 due to intensity modulation from liquid crystal wave plate (LCW) 92. LCW 92 driven by a function generator (FG) 94, together with polarizer (PO2) 96, provides roughly 30% pumping light intensity-modulation at a rate of about 2 Hz. With both feedback loops engaged, the setup is capable of measuring the clock frequency without light shift to within an accuracy of ±1 Hz or greater.

Figure 7A:
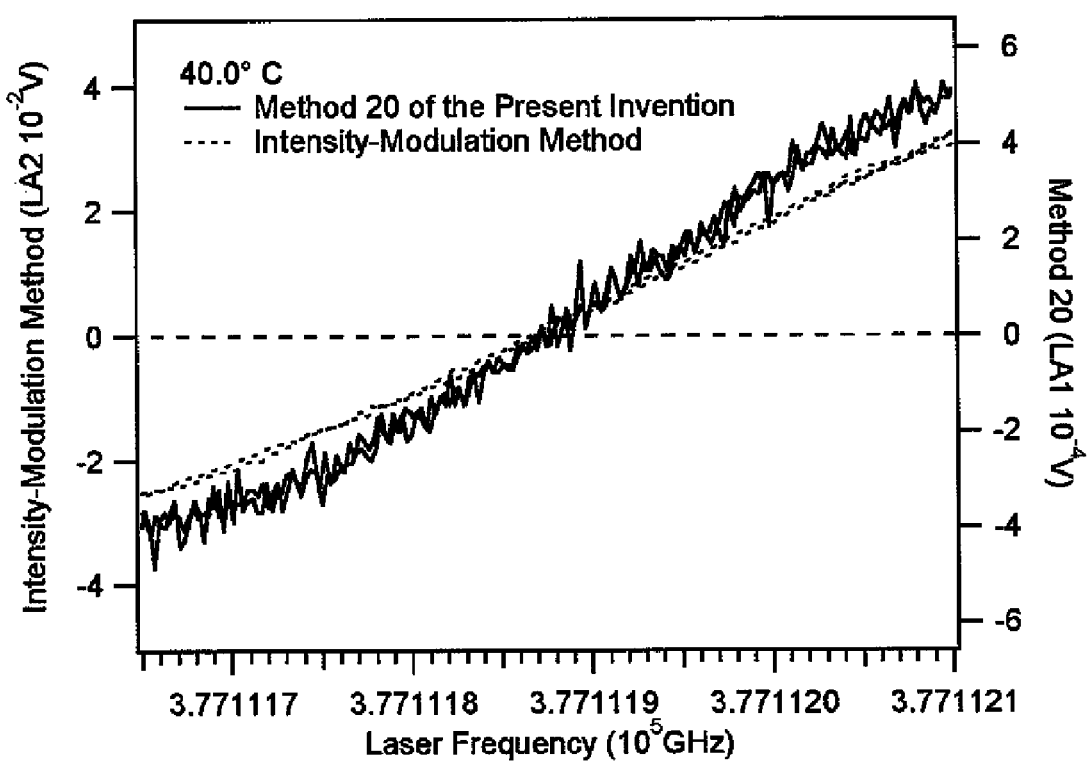
FIG. 7A is a graph of an experimental comparison of optical pumping laser frequency error signals for the method for suppressing light shift in an optical pumping system of the present invention and an intensity-modulation light shift elimination method at 40.0° C.
Figure 7B:
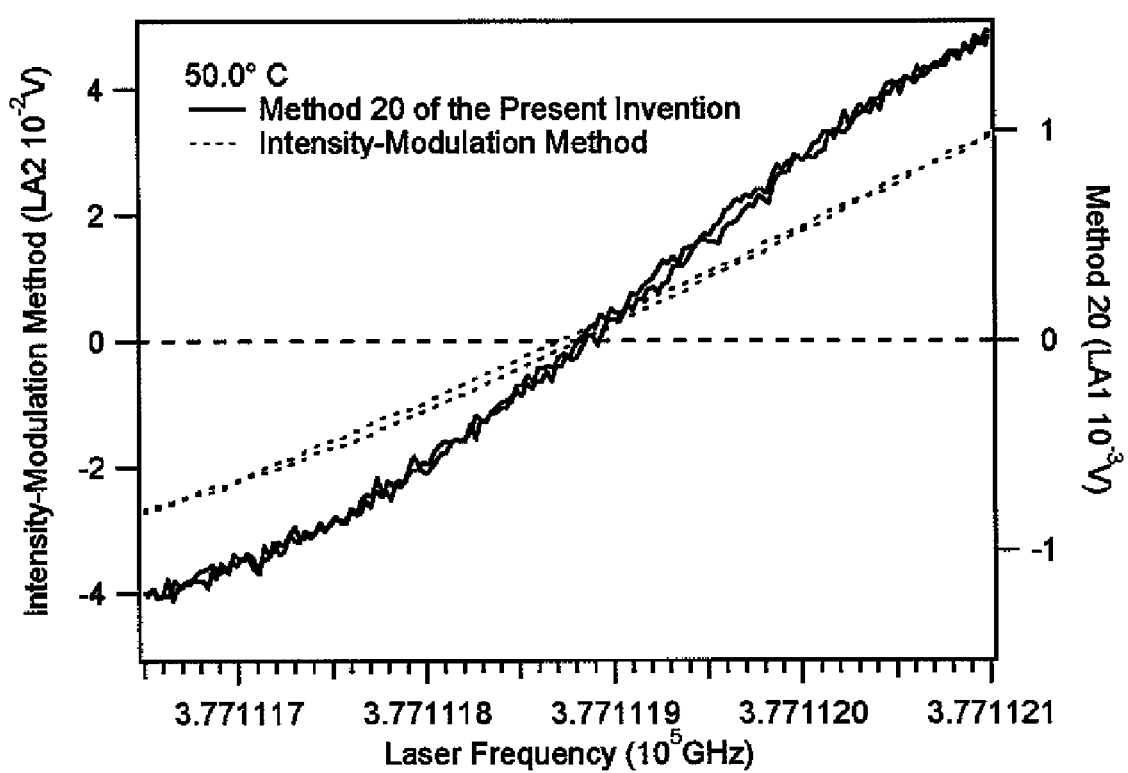
FIG. 7B is a graph of an experimental comparison of optical pumping laser frequency error signals for the method for suppressing light shift in an optical pumping system of the present invention and an intensity-modulation light shift elimination method at 50.0° C.
Figure 7C:
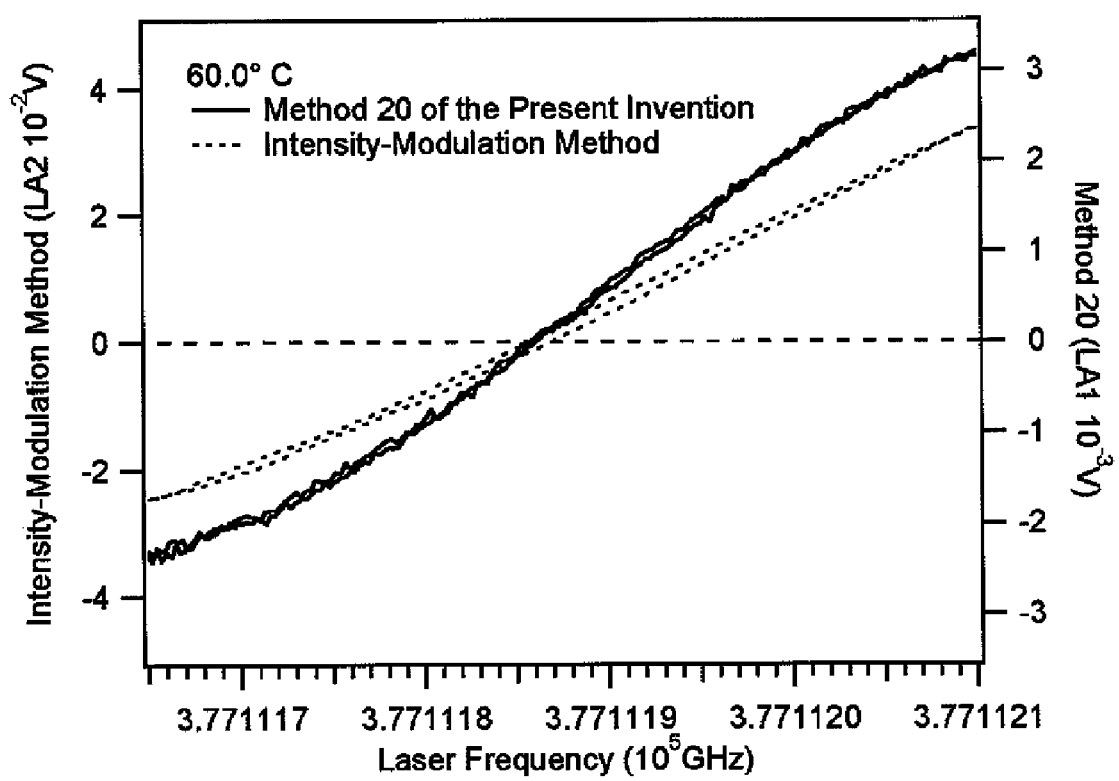
FIG. 7C is a graph of an experimental comparison of optical pumping laser frequency error signals for the method for suppressing light shift in an optical pumping system of the present invention and an intensity-modulation light shift elimination method at 60.0° C.

FIGS. 7A-7C are experimental comparisons of optical pumping frequency error signals for the method for suppressing light shift in an optical pumping system 40 of the present invention and the above-described intensity-modulation method in optical pumping system 50. Without engaging the second feedback loop to lock the pumping laser frequency, the laser frequency error signals were measured from the method for suppressing light shift in an optical pumping system 40 of the present invention and the intensity-modulation method in an optical pumping system 50 as a function of laser (DL) 41 detuning. For these tests, the cell was filled with 30.0 Torr of $N_2$ (at 50.0° C.). FIGS. 7A-7C show the results for 40.0° C., 50.0° C., and 60.0° C., showing that both the method for suppressing light shift in an optical pumping system 40 of the present invention and the intensity-modulation method produce an error signal with the same zero-crossing frequency to within experimental error. Accordingly, the method for suppressing light shift in an optical pumping system 40 of the present invention locks to the same laser frequency as the intensity-modulation based method, which is the zero-light-shift frequency. It is shown that the signal to noise ratio improves with higher temperatures in the embodiment 40 of the method for suppressing light shift in an optical pumping system of the present invention, which is due to increased optical thickness of the vapor cell 42.

Figure 8:
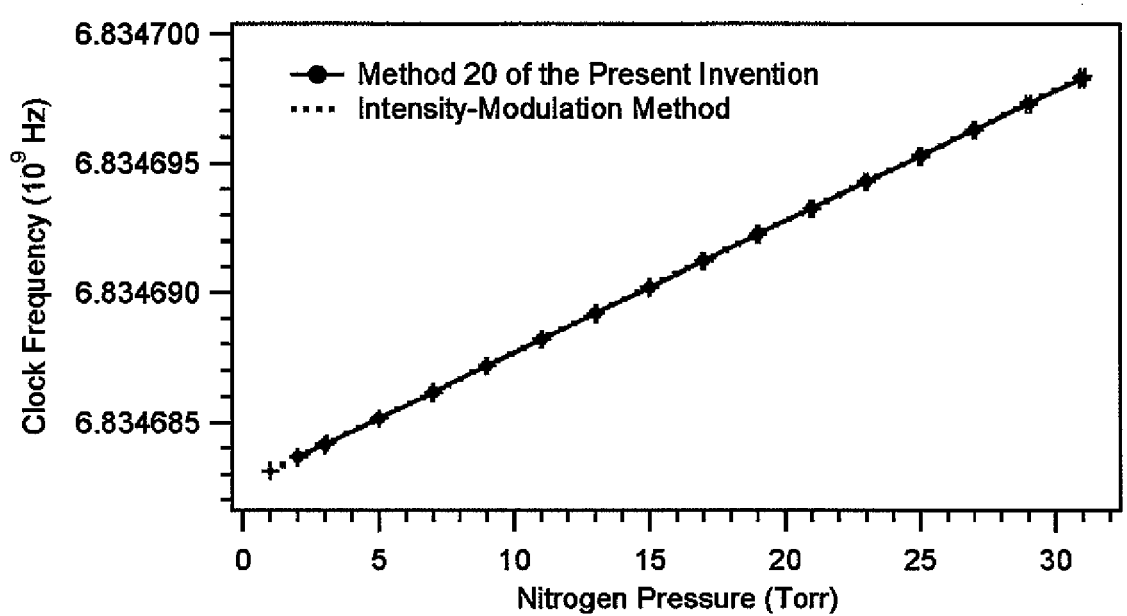
FIG. 8 is a graph of an experimental comparison of clock frequency measurements as a function of nitrogen buffer-gas pressure at 50.0° C. for the method for suppressing light shift in an optical pumping system of the present invention and an intensity-modulation light shift elimination method.

FIG. 8 is a experimental comparison of clock frequency measured as a function of nitrogen buffer gas pressure at 50.0° C. for the method for suppressing light shift in an optical pumping system 40 of the present invention and the intensity-modulation system 50. Table 1 shows the linear fit coefficients to the data:

TABLE 1

|  | Intercept (Hz) | Slope (Hz/Torr) |
|---|---|---|
| Method 20 of the present invention: | 6,834,682,623.4 ± 4.5 | 506.14 ± 0.50 |
| Intensity-Modulation Method: | 6,834,682,617.3 ± 4.1 | 507.34 ± 0.48 |

The measured data agree to within experimental error. Therefore, the method for suppressing light shift in an optical pumping system 20 of the present invention operates as well as the intensity-modulation method over a wide range of buffer-gas pressure.

Figure 9:
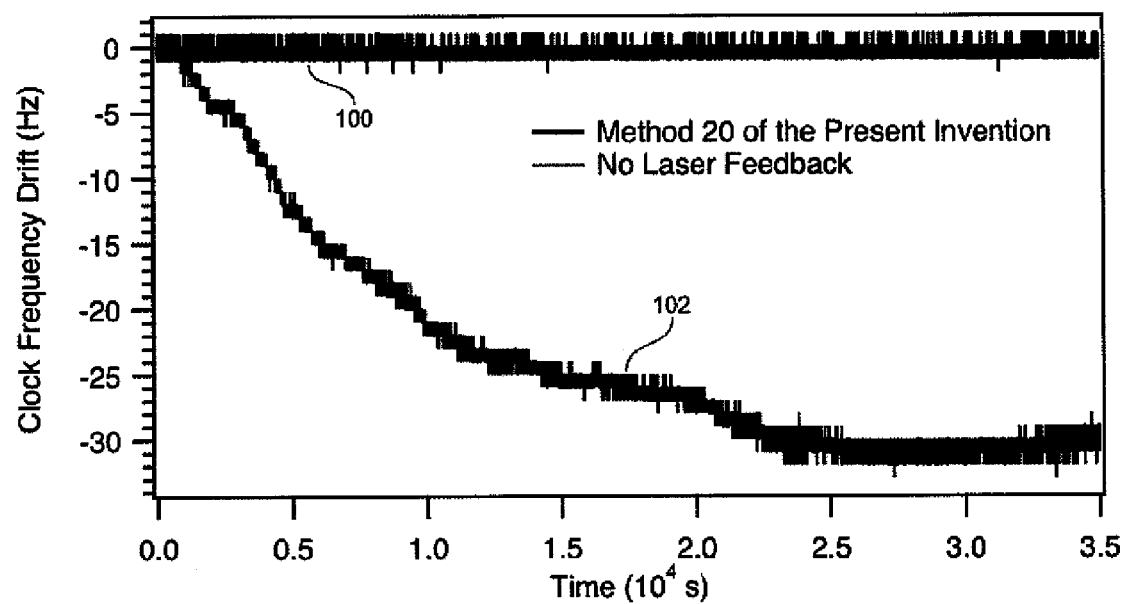
FIG. 9 is a graph of an experimental comparison of clock stability with and without the method for suppressing light shift in an optical pumping system of the present invention.

FIG. 9 is a graph of an experimental comparison of clock frequency drift with and without the method for suppressing light shift 20 in an optical pumping system 40. The time measurement of clock stability was performed using a 27.1 Torr mixture of nitrogen and argon at 52.6° C. The drift with method 20 is graphed as 100, and the drift without method 20 is graphed as 102. The stability of the clock frequency improved using the method for suppressing light shift in an optical pumping system 20 compared to a free-run system without light shift elimination.

Figure 10A:
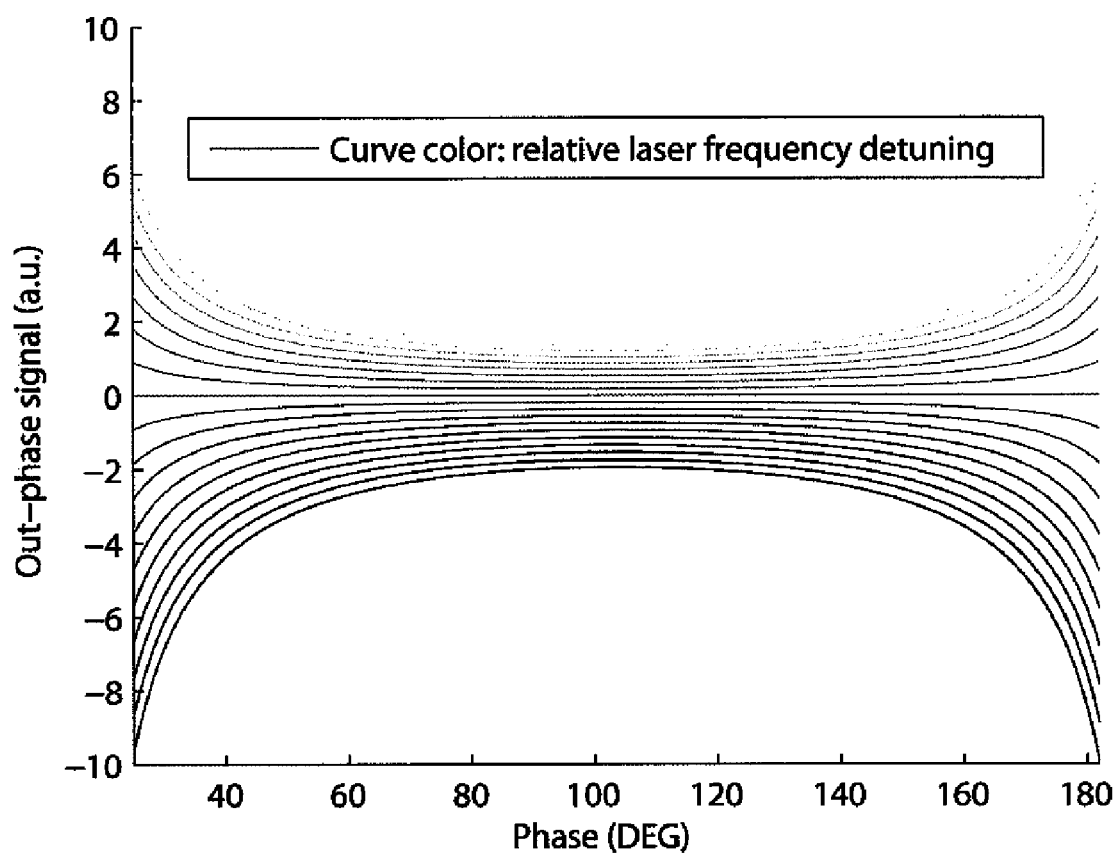
FIG. 10A is a graph of a numerical model for an out-of-phase error signal versus lock-in phase for fixed laser frequency detuning, with the microwave frequency locked to the atomic resonance.
Figure 10B:
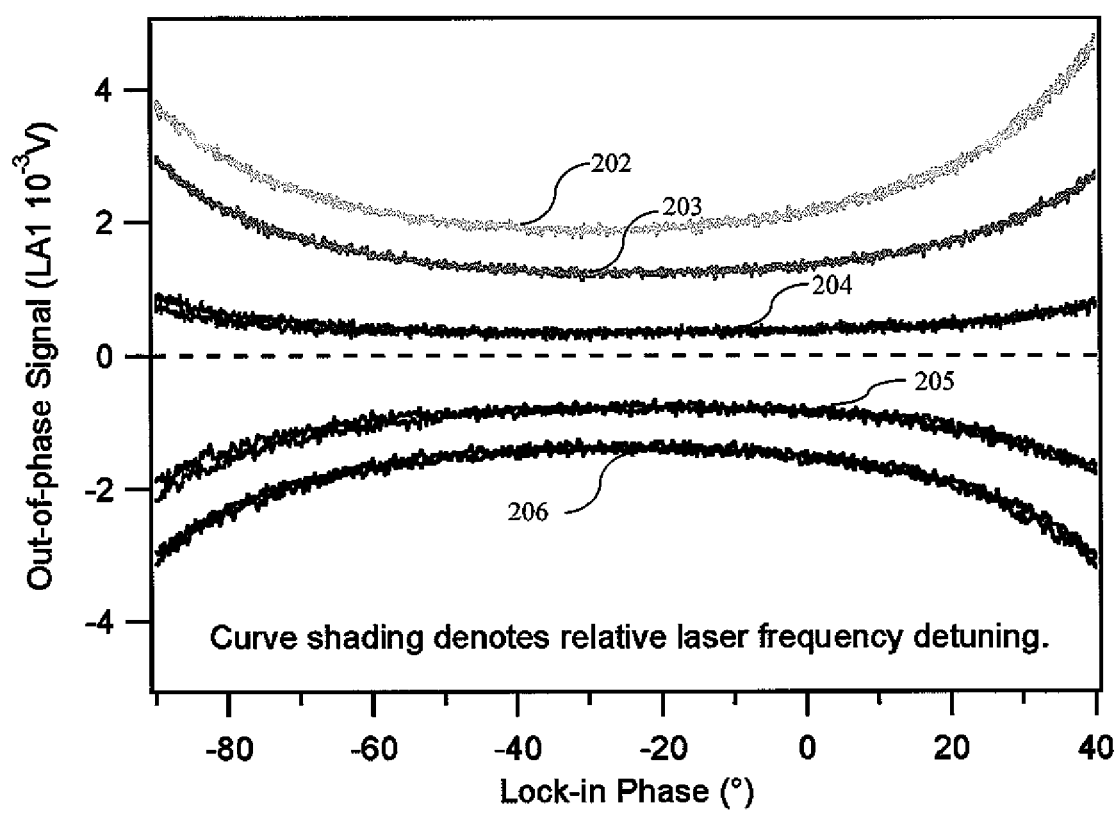
FIG. 10B is a graph of experimental results for an out-of-phase error signal versus lock-in phase for fixed laser frequency detuning, with the microwave frequency locked to an atomic resonance.
Figure 11A:
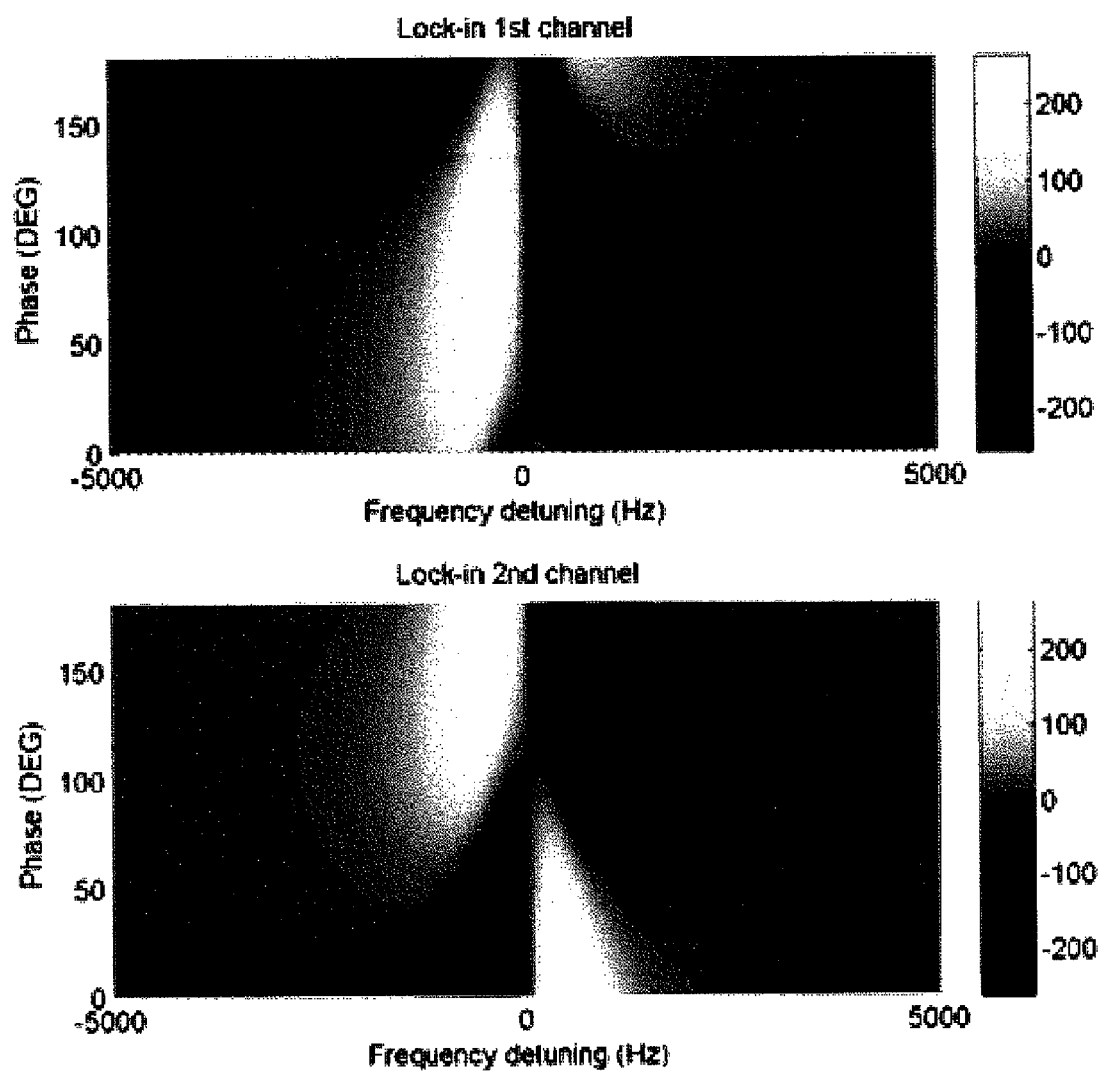
FIG. 11A is a graph of a numerical model for lock-in error signals versus lock-in phase and microwave frequency.
Figure 11B:
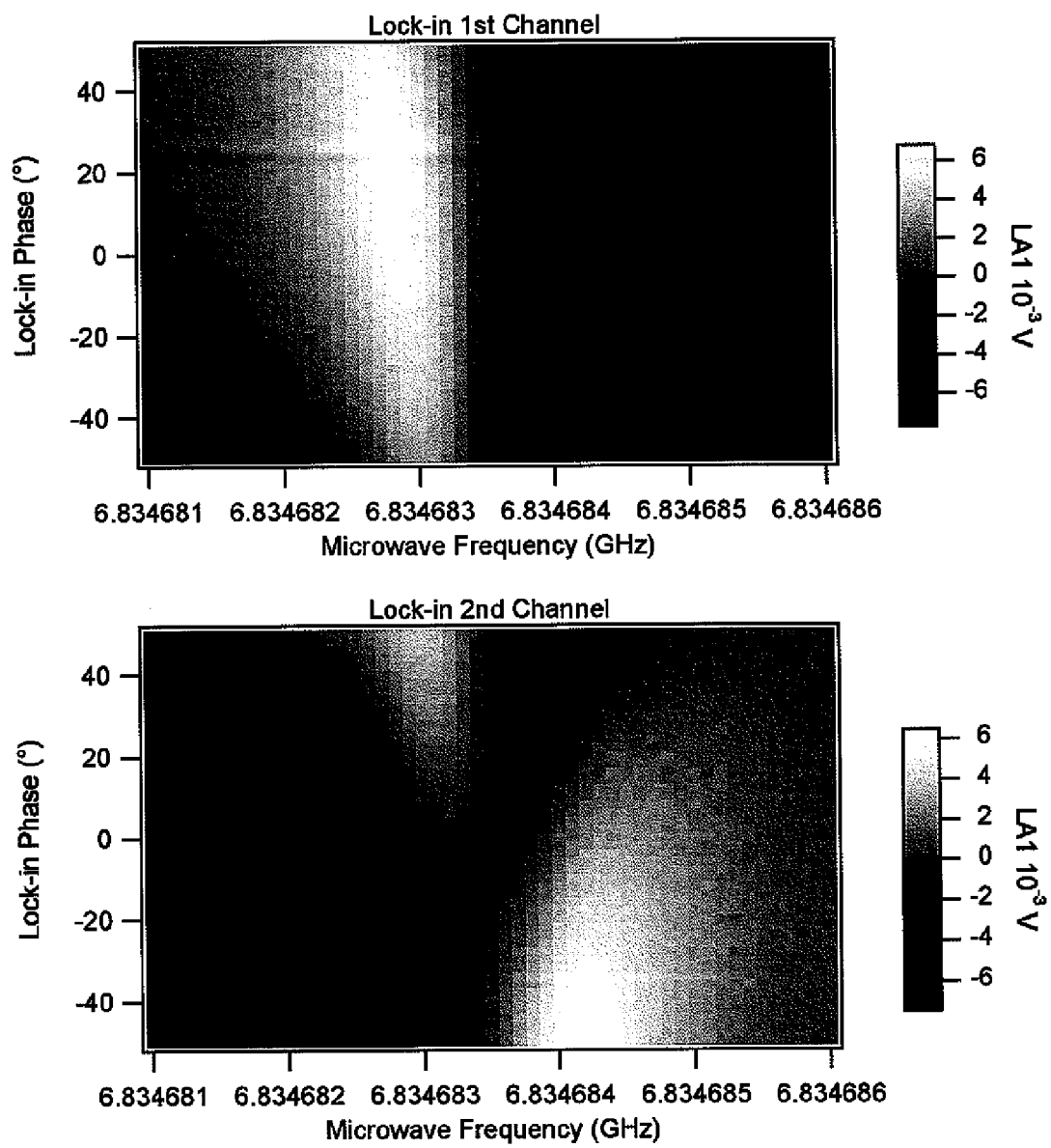
FIG. 11B is a graph of experimental results for lock-in error signals versus lock-in phase and microwave frequency for an experimental test of the system of the present invention.

The method for suppressing light shift in an optical pumping system 20 was modeled in MATLAB, and compared with experimental results from the system 40. FIG. 10A-10B compare the out-of-phase error signal versus lock-in LA1 76 phase at fixed laser (DL) 41 frequency detuning, while the radiation source frequency is locked to an atomic resonance. Different shading denotes different laser frequency detuning from the zero-shift frequency. Curve 202 represents roughly 250 MHz detuning, curve 203 roughly 150 MHz, curve 204 roughly 50 MHz, curve 205 roughly −100 MHz, and curve 206 roughly −200 MHz detuning from the zero-shift frequency, respectively. Experimental values were recorded with 30.0 Ton nitrogen at 50.0° C. FIGS. 11A-11B compare both in-phase and out-of-phase lock-in LA1 76 error signals without laser feedback for the numeral model and experimental values. The experimental values were recorded with 1.0 Ton nitrogen at 40.0° C. The figures are image plots, where shading denotes values according the plot legend. Both figures demonstrate qualitative agreement between numerical modeling and experimental tests. Both experiment and modeling show that the selection of lock-in LA1 76 phase is not critical for the quadrature error signal in system 40.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

What is claimed is:

1. A method for suppressing light shift in an optical pumping system comprising the steps of:
    optically pumping an atomic sample of an optical pumping system with a pumping source;
    exciting atomic resonances with a modulated radiation source; and
    simultaneously locking a frequency of the radiation source to an atomic resonance and locking a frequency of the pumping source using error signals due to the modulated radiation source, thereby suppressing or eliminating light shift in the optical pumping system.

2. The method of claim 1 wherein the pumping source frequency is locked to a zero-light-shift frequency thereby eliminating light shift in the optical pumping system.

3. The method of claim 1 wherein the atomic sample comprises an atomic vapor cell, an atomic beam, or an atom trap.

4. The method of claim 1 wherein the pumping source comprises a laser.

5. The method of claim 1 wherein the radiation source comprises a radio frequency source or a microwave source.

6. The method of claim 1 wherein the pumping source and the radiation source are combined in a coherent population trapping method.

7. The method of claim 1 wherein the pumping source and the radiation source comprise a double resonance spectroscopy method.

8. The method of claim 1 wherein the method of the modulation of the radiation source is a frequency modulation method or a phase modulation method.

9. The method of claim 1 wherein the error signal for locking the pumping source is obtained from the out-of-phase signal from a phase sensitive detector, where an in-phase signal from the phase sensitive detector is used for locking the radiation source.

10. The method of claim 1 wherein the optical pumping system is an atomic frequency standard, an atomic clock, an atomic magnetometer, a maser, a spectroscopy system associated with optical pumping, or an atomic system associated with optical pumping.

11. A system for suppressing light shift in an optical pumping system comprising:
    means for optically pumping an atomic sample of an optical pumping system with a pumping source;
    means for exciting atomic resonances with a modulated radiation source; and
    means for simultaneously locking a frequency of the radiation source to an atomic resonance and locking a frequency of the pumping source using error signals due to the modulated radiation source, thereby suppressing or eliminating light shift in the optical pumping system.

12. The system of claim 11 wherein the pumping source frequency is locked to a zero-light-shift frequency thereby eliminating light shift in the optical pumping system.

13. The system of claim 11 wherein the atomic sample comprises an atomic vapor cell, an atomic beam, or an atom trap.

14. The system of claim 11 wherein the pumping source comprises a laser.

15. The system of claim 11 wherein the radiation source comprises a radio frequency source or a microwave source.

16. The system of claim 11 wherein the pumping source and the radiation source are combined in a coherent population trapping method.

17. The system of claim 11 wherein the pumping source and the radiation source comprise a double resonance spectroscopy method.

18. The system of claim 11 wherein the means of the modulation of the radiation source is a frequency modulation method or a phase modulation method.

19. The system of claim 11 wherein the error signal for locking the pumping source is obtained from the out-of-phase signal from a phase sensitive detector, where an in-phase signal from the phase sensitive detector is used for locking the radiation source.

20. The system of claim 11 wherein the optical pumping system is an atomic frequency standard, an atomic clock, an atomic magnetometer, a maser, a spectroscopy system associated with optical pumping, or an atomic system associated with optical pumping.

* * * * *

UNITED STATES PATENT AND TRADEMARK OFFICE
CERTIFICATE OF CORRECTION

PATENT NO.       : 7,825,736 B2                    Page 1 of 1
APPLICATION NO.  : 12/338044
DATED            : November 2, 2010
INVENTOR(S)      : McGuyer et al.

It is certified that error appears in the above-identified patent and that said Letters Patent is hereby corrected as shown below:

In the Specifications:

Column 1, line 7, delete the text "Air Force Office Scientific Research 245-6581 and Department of Defense NDSEG Fellowship" and insert --Grant #FA9550-07-1-0103 awarded by the Air Force Office of Scientific Research--

Signed and Sealed this
Eighth Day of February, 2011

David J. Kappos
*Director of the United States Patent and Trademark Office*